(12) United States Patent
Chiluvuri et al.

(10) Patent No.: US 7,086,027 B1
(45) Date of Patent: Aug. 1, 2006

(54) METHOD AND APPARATUS FOR CONSTRAINT GRAPH BASED LAYOUT COMPACTION FOR INTEGRATED CIRCUITS

(75) Inventors: Venkata K. R. Chiluvuri, Austin, TX (US); Alexander Mikhailovich Marchenko, Moscow (RU); Mikhail Anatolievich Sotnikov, Moscow (RU)

(73) Assignee: Freescale Semiconductor, Inc., Austin, TX (US)

( * ) Notice: Subject to any disclaimer, the term of this patent is extended or adjusted under 35 U.S.C. 154(b) by 328 days.

(21) Appl. No.: 10/332,111

(22) PCT Filed: Jul. 3, 2000

(86) PCT No.: PCT/RU00/00280

§ 371 (c)(1),
(2), (4) Date: Oct. 29, 2003

(87) PCT Pub. No.: WO02/03260

PCT Pub. Date: Jan. 10, 2002

(51) Int. Cl.
  *G06F 17/50* (2006.01)
(52) U.S. Cl. .................... 716/11; 716/2; 716/12
(58) Field of Classification Search .......... 716/2, 716/11, 12, 14
See application file for complete search history.

(56) References Cited

U.S. PATENT DOCUMENTS 5,984,510 A  11/1999  Guruswamy et al.
6,434,721 B1 * 8/2002  Chiluvuri et al. .............. 716/2

OTHER PUBLICATIONS

Bamji, Cyrus et al; Incremental Autojogging Using Range Spaces; Proceedings Eleventh International Conference on VLSI Design; Jan. 4-7, 1998; pp. 265-268; XP-002162467; IEEE.

Dunlop, A.E.; SLIM-The Translation of Symbolic Layouts into Mask Data; Proceedings of the 17th Design Automation Conference; Jun. 23-25, 1980; pp. 595-602; XP-000989688; IEEE.

Cho, Y. Eric; A Subjective Review of Compaction; Proceedings of the Design Automation Conference; Jun. 1, 1985; pp. 396-404, XP-000756796; IEEE.

* cited by examiner

*Primary Examiner*—Thuan Do

(57) ABSTRACT

A method of compacting a circuit layout includes determining a critical path of the circuit layout, the critical path having a length not less than a length of each other path of the circuit layout. The method further includes representing the critical path to include a plurality of vertices and a plurality of edges, each one of the vertices being coupled to another of the vertices by an edge, the plurality of vertices including a flexible vertex corresponding to a flexible element of the circuit layout, the plurality of edges including a first shear edge. The method further includes representing the flexible vertex to include a first jogging edge. The method further includes determining an optimal cutest of the graph of the critical path, the cutest including at least one of the group consisting of the first jogging edge and the first shear edge.

11 Claims, 5 Drawing Sheets

METHOD AND APPARATUS FOR CONSTRAINT GRAPH BASED LAYOUT COMPACTION FOR INTEGRATED CIRCUITS

FIELD OF THE INVENTION

The present invention relates to layout compaction for integrated circuit design automation, and more particularly to constraint graph-based layout compaction that compacts circuit elements in two dimensions during the design automation stage of a circuit layout with reduced computational requirements.

DESCRIPTION OF RELATED ART

Compaction is an important design automation stage in the phased approach to layout synthesis of integrated circuits (ICs), such as a very large scale integration (VLSI) design. The compaction operation converts symbolic layouts generated by other layout synthesis tools into mask data or physical layouts and attempts to optimize the area of the layout without changing the circuit or violating the design rules. In other words, it is desired to make each chip as small as possible while maintaining design rule correctness (DRC). Today, the most attractive approach to mask layout compaction is graph-based compaction, which provides a robust basis for a one- and two-dimensional compaction.

Layout compaction algorithms typically range between one-dimensional and two-dimensional compaction. In one-dimensional compaction, only one coordinate of the layout geometry is changed at a time, such as either X compaction or Y compaction. The goal of one-dimensional compaction is to minimize the length of one dimension or direction, whereas the other direction, referred to as the shear or orthogonal direction, is not affected and remains constant. It is noted that dimension and direction are often used interchangeably herein. The goal of two-dimensional compaction is to modify both X and Y coordinates simultaneously in order to minimize area. Many one-dimensional compaction algorithm versions can be solved efficiently without consuming significant computational resources. A few proposed versions of one-dimensional compaction and most two-dimensional compaction proposals are "NP-hard", which means that they are computationally prohibitive and not practicable. The difficulty of two-dimensional compaction lies in determining how the two dimensions of the layout interact to minimize the area. To circumvent the intrinsic complexity of this problem, some heuristic methods have been proposed to relate both dimensions of the compaction. Such heuristic proposals are often referred to as "1.5-dimensional" compaction since, although they interrelate the two dimensions, they do not optimally solve the two-dimensional compaction problem.

Some 1.5 dimensional compaction methods have been proposed in which the layout is essentially compacted in a preferred direction, while changing the shear or orthogonal direction. In the process of achieving the primary goal of decreasing the extent of the layout in the preferred direction, these compaction techniques also make coordinate changes in the shear direction. Each local change is called a reorganization. One heuristic framework has been proposed, called "super compaction", for carrying out feasible reorganization such that the length of the longest path in the layout graph for the preferred direction is decreased. This approach is known as "shearing" compaction. Another method to minimize the critical path in the constraint graph is referred to as "jog insertion".

Unfortunately, the shearing and jog insertion methods have been applied in sequence and have not been applied simultaneously. As a result, the existing algorithms cannot compact most layouts very efficiently. Shearing and jog insertion techniques in sequence can optimize the layout, but only if a sequence of the shearing and jog insertion methods are applied sequentially where each particular step improves the objective. The existing compaction algorithms, however, cannot apply critical path reduction techniques of shearing and jog insertion simultaneously and therefore optimal solutions are not available for most designs.

DETAILED DESCRIPTION

Figure 1:
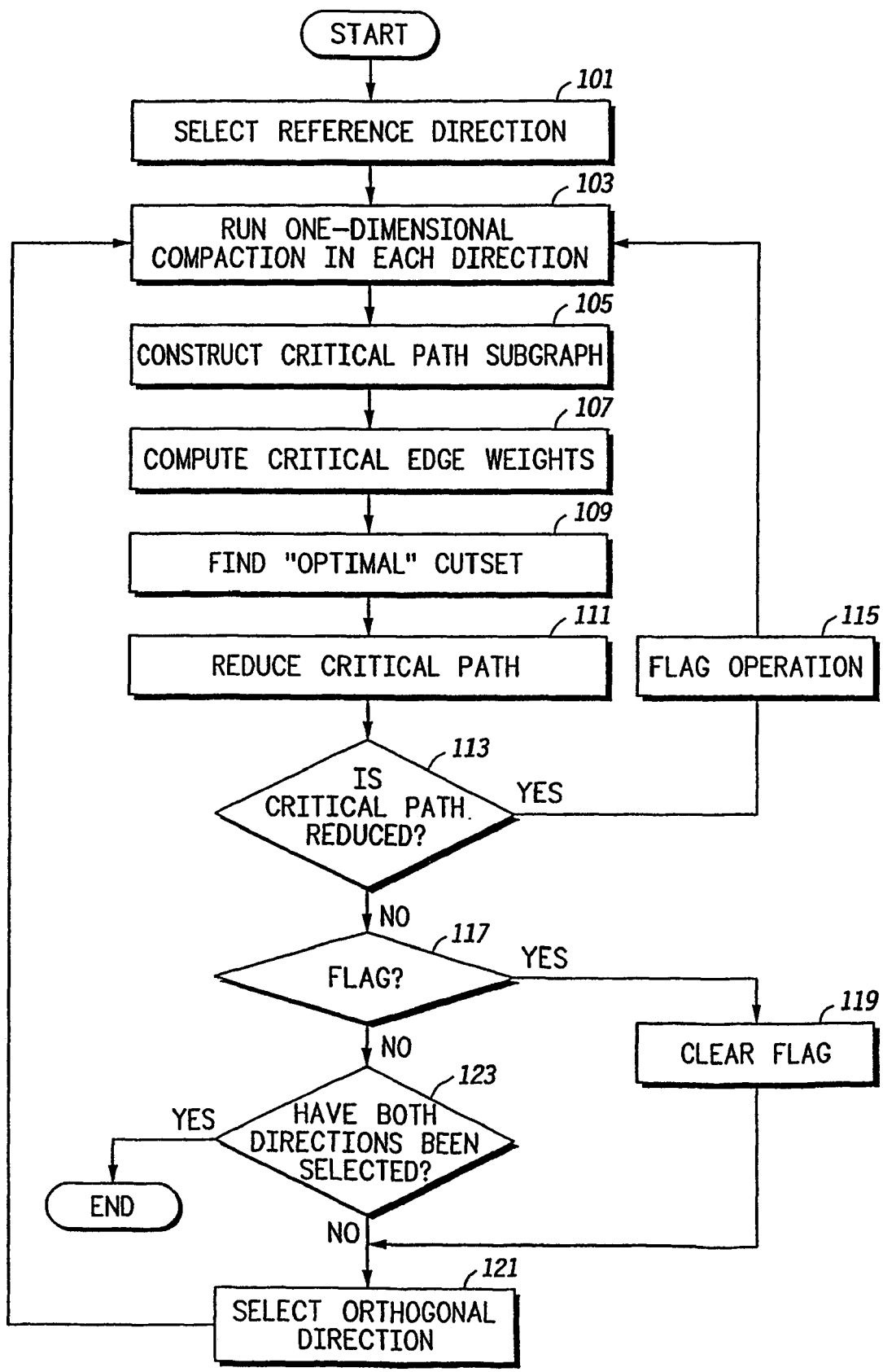
FIG. 1 is a flow chart diagram illustrating a constraint graph-based layout compaction method according to an embodiment of the present invention.

The following discussion is intended to provide a detailed description of at least one example or embodiment of the invention and should not be taken to be limiting of the invention itself. Rather, any number of variations may fall within the scope of the invention which is properly defined in the claims following this description.

Various embodiments of apparatus and methods of layout compaction which combine both the techniques of shearing and jog insertion are provided herein to address a problem often encountered in graph-based layout compaction. Such embodiments are useful in design automation of circuit layouts such as, for example, very large scale integration (VLSI) design. During the engineering process, a high level representation of a circuit is typically converted to the gate-level by replacing functional blocks with more specific gate-level or component-level representations. The gate-level representation is further converted to a circuit-level representation, where each gate or component is replaced with more specific electronic circuit elements such as transistors, resistors, capacitors, diodes, etc. The circuit level representation is then transformed to a layout representation for mapping the elements or components onto a particular integrated circuit (IC) or chip. The circuit layout representations are used to generate masks such as positive or negative films or the like, which are then provided to a fabrication process to manufacture the chips. A plurality of such chips are typically laid out in array or matrix fashion onto a wafer or semiconductor substrate during the manufacturing process.

The embodiments described herein are especially relate to the circuit layout step of design automation and more particularly to compacting the circuit layout to improve the end product. The circuit layout representation is converted to a constraint graph representation, which is then imposed or optimized and then converted back to an improved layout representation. In the constraint graph, each circuit element is converted to a corresponding vertex between a source vertex (e.g., a side of the circuit layout) and a sink vertex (e.g., another side of the circuit layout) in a reference direction. Minimum spacing requirements between the circuit elements are represented by edges provided between vertices corresponding to the circuit elements. Edges can be represented by arrows with corresponding minimum length values. In the embodiments described herein, a path typically includes a set of one or more vertices between the source and sink and the edges which couple the vertices, source and sink. Sometimes a path may be the circuit elements and sides (and the spaces between them) corresponding to the vertices, source and sink (and edges), as determined by the relevant context. An orthogonal constraint graph is also constructed in the shear or orthogonal direction in a similar manner.

A critical path subgraph is then constructed based upon the reference and orthogonal constraint graphs. In particular, one or more paths are chosen as the longest paths between the source and sink vertices of the reference constraint graph. One of the longest paths can be chosen as the critical path. Each vertex included in the one or more critical paths of the constraint graph is included in the critical path subgraph. To construct the critical path subgraph, each vertex in the constraint graph is converted to an input vertex for each incoming edge (e.g., an edge coupled to the vertex on the source side of the vertex), where the incoming edge is referred to as a shear edge. If the vertex has an outgoing edge (e.g., an edge coupled to the vertex on the sink side of the vertex), an output vertex is created for each outgoing edge, where the outgoing edge is also referred to as a shear edge. Further, an edge is created between each input vertex and each output vertex. The edge between the input and output vertex is a jogging edge if the corresponding circuit element is a flexible circuit element (e.g., a wire) which can change form.

For each edge in the critical path subgraph, the orthogonal constraint graph is used to determine if the edge can be used in an optimal cutset. If not, it's weight is assigned as "None". If the edge can be used in the cutset, and if it is a shear edge, it is assigned a weight equal to the shear edge's length in the constraint graph. For jogging edges, a weight is defined as the minimum of the length between the source and the vertex, and the length between the sink and the vertex. The cutset is determined and the critical path is reduced based on the cutset. Thus, optimization is done in the graph domain. The procedure may be repeated until the circuit layout is substantially optimized at acceptable levels of computation.

There are several rules and other information that are used to convert a circuit layout to graph representation, such as process or spacing rules, electronic connectivity information and other user-defined rules depending upon the elements or objects of the layout. The layout tool has some heuristic rules to follow to initially layout the physical circuit elements. Such rules include spacing or proximity rules and other rules that define limits on height, width and area of the overall chip. Height, width or area limits may be necessary for the chip if being placed within a larger module with certain spacing requirements that must be followed. Layout compaction does not attempt to reroute the electrical connections but instead maintains the existing routing while minimizing the spacing between elements. Some elements are "fixed" while others are flexible and may be modified. A fixed object or element should not be modified since modification would either destroy its function or otherwise modify its operation or characteristics. A flexible element is one that can be changed without substantially affecting its electrical or functional characteristics, such as by "jogging" a wire or the like. It is noted, however, that fixed and flexible elements may be moved in either or both dimensions as long as spacing and other rules are maintained and not violated.

Figure 2:
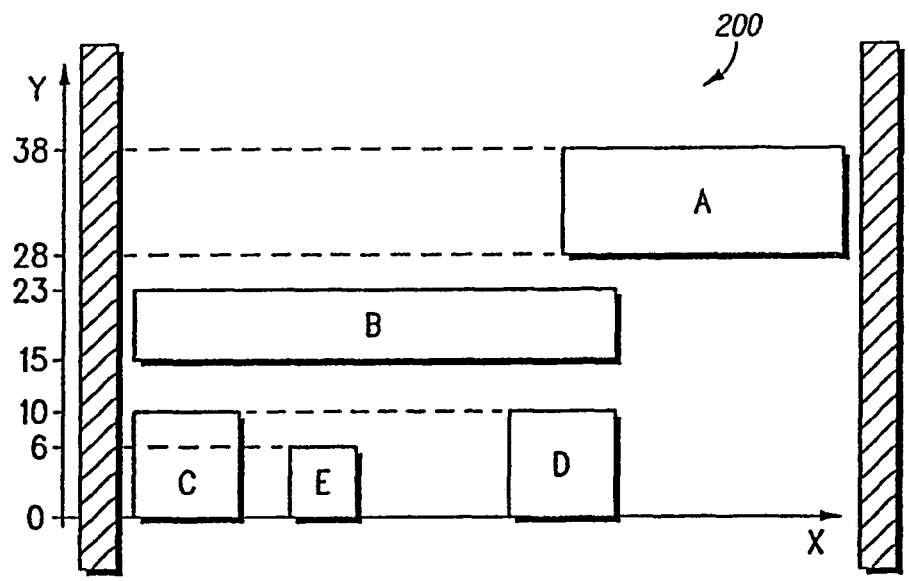
FIG. 2 is an exemplary initial layout prior to compaction.

FIG. 1 is a flow chart diagram illustrating a constraint graph based layout compaction method according to an embodiment of the present invention. At a first block 101, a reference direction of a layout is selected. The reference direction may be arbitrarily chosen or may otherwise be the more critical dimension for particular designs depending upon height, width or area criterion. An exemplary initial layout 200 is shown in FIG. 2. In this initial layout 200, various components, individually labeled A, B, C, D and E, are shown at various placements according to heuristic techniques previously described. The A, C, D and E elements are fixed and the B element is flexible. A first direction is referred to as the X direction (shown in the horizontal direction) and a second direction is referred to as the Y direction (shown in the vertical direction). A scale is shown along the Y direction referring to units of length, such as microns. One of the directions, such as the Y direction, will be selected as a reference direction for optimization while the other direction, such as the X direction, is the shear or orthogonal direction. The reference and orthogonal directions may be swapped or exchanged during the compaction method (such as the orthogonal direction becoming the reference direction and vice-versa). As shown in FIG. 2, elements C, E and D are distributed along the X direction at the lowest Y direction value. Element B is positioned above the C, E and D elements at a particular separation, which in this case 5 microns. Element A is placed above the B element at an offset of 5 microns and offset toward the right side edge. It is desired to compact this initial layout 200 to improve design and operation characteristics. However, this particular initial layout 200 may not be optimized by using prior art 1.5 dimensional compaction techniques because the shearing and jog insertion approaches are done separately.

At first block 101, a reference direction is selected which could either be the X or Y direction of the initial layout 200. In the embodiment shown; the Y direction is first chosen as the reference direction. Operation proceeds to next block 103, in which one-dimensional compaction techniques are performed in each direction on the initial layout 200. In particular, the one-dimensional compaction technique is applied to the reference direction (or the Y direction) first followed by another one-dimensional compaction applied to the X direction. It is noted that the initial layout 200 may already be compacted such that one-dimensional techniques may not provide further compaction. However, for many initial layouts, the one-dimensional compaction may improve compaction somewhat before application of the methods set forth herein.

Figure 3:
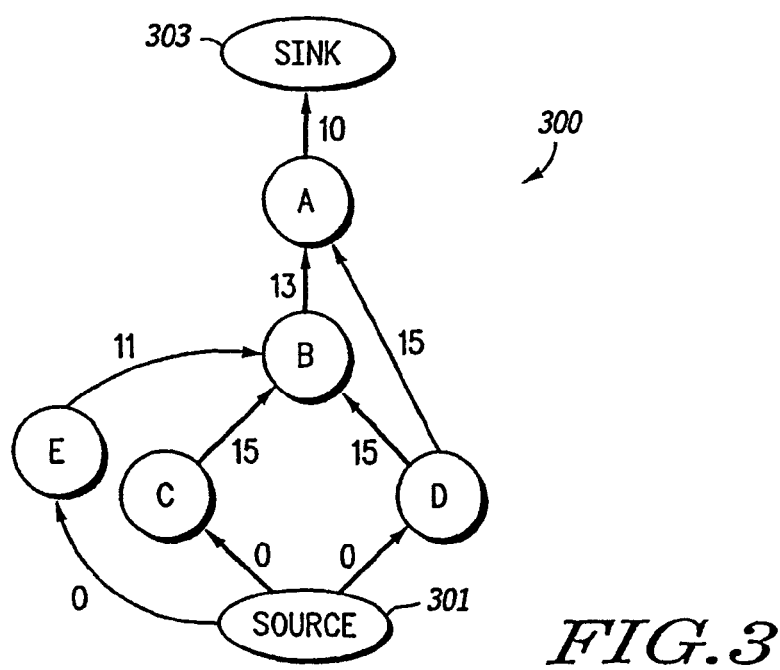
FIG. 3 is a constraint graph representation of the initial layout of FIG. 2.
Figure 6:
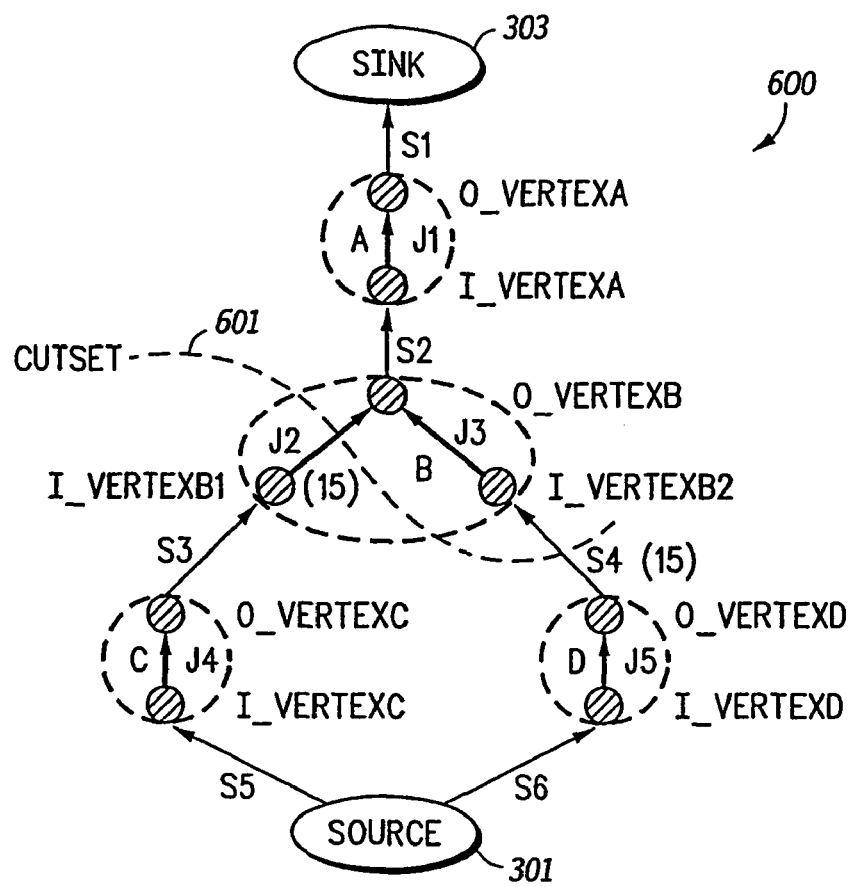
FIG. 6 is an exemplary critical path subgraph resulting from operation of the method illustration in FIG. 5.

At next block 105, a critical path subgraph 600 FIG. 6) is constructed. Before the critical path subgraph 600 can be constructed, it is first necessary to construct a constraint graph 300 (FIG. 3) and an orthogonal constraint graph 400 (FIG. 4) of the initial layout 200. FIG. 3 is the constraint graph 300 of the initial layout 200 using the Y direction as the reference direction. The elements A, B, C, D and E are ea converted to vertices between a source vertex 301 and a sink vertex 303. Between any vertices including the source vertex 301 and the sink vertex 303, edges are represented by arrows having a numeric length value assigned to each edge arrow representing minimum spacing requirements between the corresponding circuit elements. Each numeric length value represents a center-to-center minimum spacing or distance between elements, tailing into account dimensional size or width of the respective elements. The minimum length values may be zero for elements that can touch or that must touch and cannot be separated. The minimum length values may also indicate direction such as having positive or negative values. As shown in FIG. 3, the vertices C, D and E can be directly touching the source vertex 301. A minimum length value of 15 is provided between vertices C and B, D and B, and D and A, respectively. A length value of 11 is provided between vertices E and D, a length value of 13 is provided between vertices B and A, and a length value of 10 is provided between element A and the sink vertex 303.

Figure 4:
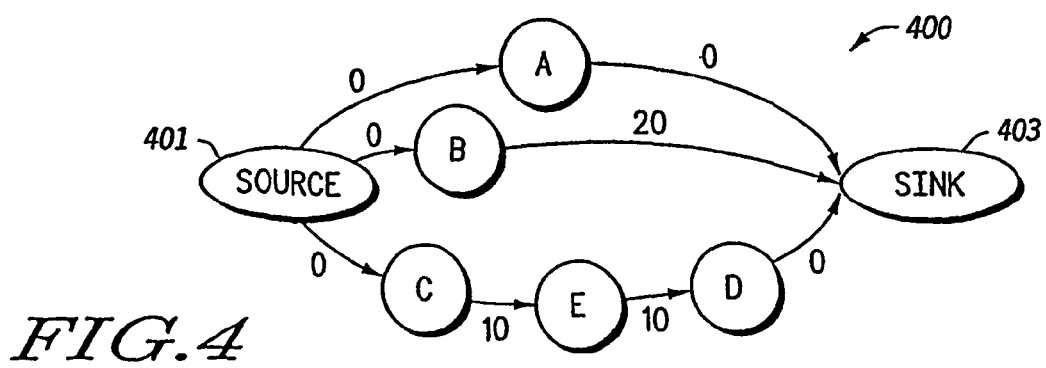
FIG. 4 is an orthogonal constraint graph of the initial layout of FIG. 2.

FIG. 4 is the orthogonal constraint graph 400 of the initial layout 200. In this case, the orthogonal direction is the X direction. Each of the elements A, B, C, D and E is again converted into corresponding vertices between a source vertex 401 and a sink vertex 403 in the X direction, where the source and sink vertices 401, 403 represent the left and right boundaries of the initial layout 200. Again, minimum length values are provided between respective vertices as necessary. For example, a minimum spacing of zero is provided between the source vertex 401 and the A vertex as well as between the A vertex and the sink vertex 403. Likewise, a minimum length value of zero is provided between the source vertex 401 and the B vertex, between the source vertex 401 and the C vertex, and between the D vertex and the sink vertex 403. A minimum length value of 20 is provided between the B vertex and the sink vertex 403. A minimum length value of 10 is shown between the C and E and the E and D vertices, respectively. As described further below, the orthogonal constraint graph 400 is utilized to select the edges for the "cutset" to reduce a "critical path". Initially, the minimum length values indicate the amount that a corresponding element may be moved in the orthogonal direction for a shear operation. The orthogonal spacing values indicate the minimum and maximum locations in the orthogonal direction that an element may move as well as the slack or amount of movement therebetween. For example, the A element has a greater level of slack than the B element, which is somewhat constrained by a minimum spacing requirement between the two edges of the layout as well as its relatively large size. Although the size of some elements may be changed, for the most part the size of the elements is fixed.

Figure 5:
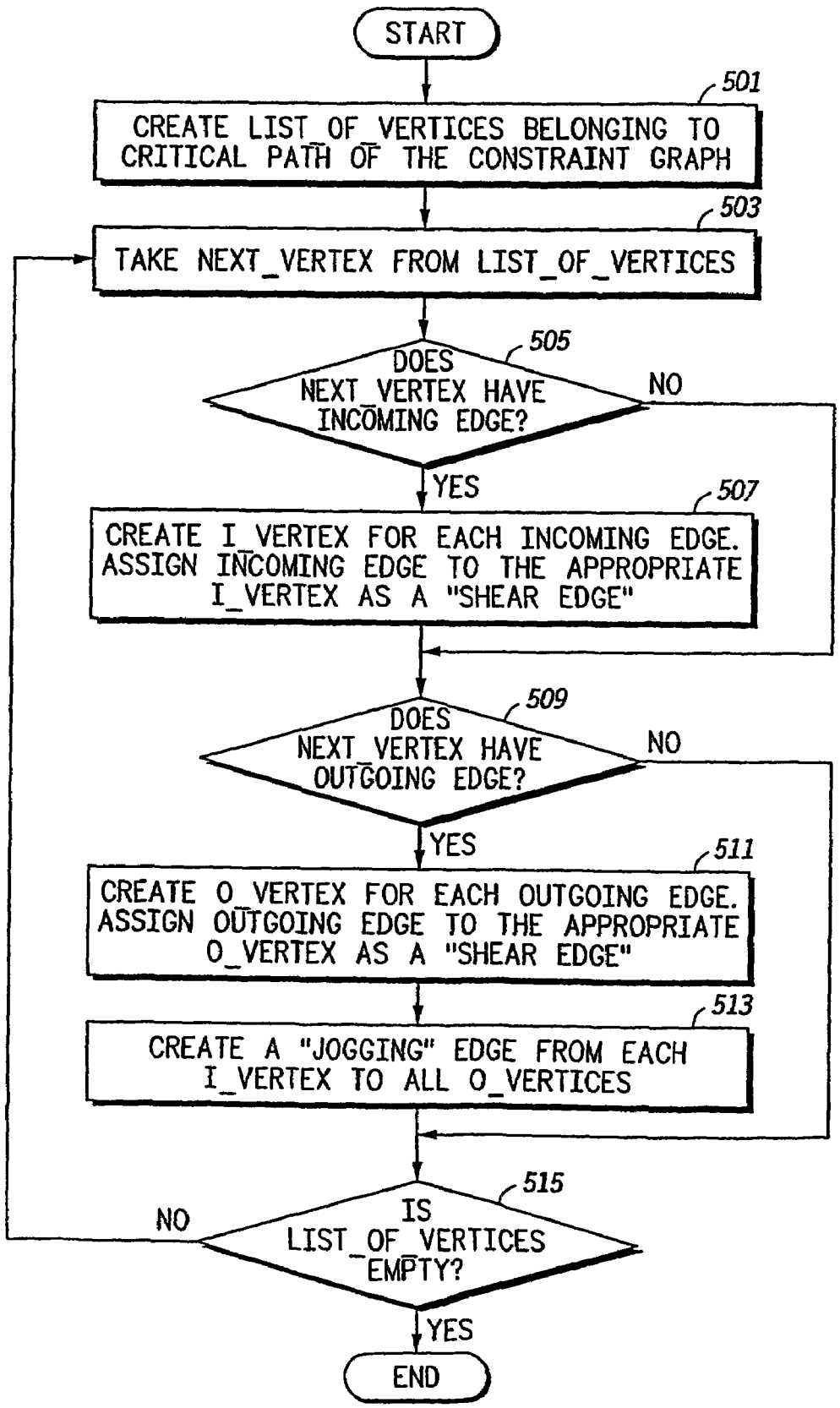
FIG. 5 is a flow chart diagram illustrating a method according to an embodiment of the present invention to build a critical path subgraph based on the constraint graph of FIG. 3.

FIG. 5 is a flow chart diagram illustrating a method to construct the critical path subgraph 600 based on the constraint graph 300 and the orthogonal constraint graph 400 of the initial layout 200. FIG. 6 is a graph of the critical path subgraph 600 resulting from the operation of FIG. 5. At a first block 501, a list of nodes belonging to a critical path of the constraint graph 300 are created. With reference to FIG. 3, the critical path or paths are chosen as the longest paths between the source and sink vertices 301, 303. Each path is referred to by the intermediate vertices and the corresponding total length, which is the sum of length values along the respective paths. For example, a first path EBA between the source and sink vertices 301, 303 has a length of 11 plus 13 plus 10 which is 34. A second path CBA has a length of 38. A third path DBA also has a length of 38. A final path DA has a length of 25. The paths CBA and DBA are both critical paths, each having the largest length of 38. Therefore, the vertices A, B, C and D are included in construction of the critical path subgraph 600 as shown in FIG. 6. At next block 503, a next vertex referred to as NEXT_VERTEX (the first vertex in the first iteration) from the list of vertices is selected, where each vertex will be considered one at a time. In the first iteration, vertex C is selected as the first vertex. The vertices will be considered in the order CDBA. At next block 505, it is queried whether the NEXT_VERTEX or vertex C in the first iteration, has an incoming edge. Since vertex C has an incoming edge from the source vertex 301, operation proceeds to block 507 in which an input vertex, referred to as I_VERTEX, is created for each incoming edge. As shown in FIG. 6, a vertex labeled I_VERTEXC is created. Also at block 507, the corresponding incoming edge is assigned to the appropriate input vertex as a "shear" edge. As shown in FIG. 6, the incoming edge is labeled "S5" and assigned as an incoming edge to the I_VERTEXC.

Operation proceeds to next block 509 in which it is queried whether the NEXT_VERTEX has an outgoing edge. Since vertex C has an outgoing edge, operation proceeds to next block 511 in which an output vertex (O_VERTEX) is created for each outgoing edge. As shown in FIG. 6, an output vertex labeled O_VERTEXC is created. Also in block 511, the corresponding outgoing edge, labeled S3, is assigned to the appropriate output vertex as a shear edge. As shown in FIG. 6, the S3 edge is assigned to the output vertex C and shown as leaving the output vertex C pointing toward the B vertex. At next block 513, a "jogging" edge is created from each input vertex to all output vertexes for the NEXT_VERTEX. As shown in FIG. 6, a jogging edge, denoted J4, is created from the input I_VERTEXC to the output O_VERTEXC. Operation then proceeds to next block 515, where it is determined whether there are any more vertices to consider. If so, operation returns to block 503 to consider the next vertex from the entire list of vertices.

As shown in FIG. 6, an input vertex I_VERTEXD and an output vertex O_VERTEXD are created for vertex D, where an incoming edge S6 from the source vertex 301 is assigned to the I_VERTEXD and the outgoing edge S4 is assigned to the vertex O_VERTEXD. Also, a jogging edge, denoted J5, is created from the vertex I_VERTEXD to the vertex O_VERTEXD. The B vertex has two incoming edges and one outgoing edge with reference to the constraint graph 300. Therefore, two vertices, I_VERTEXB1 and I_VERTEXB2, are created along with an output vertex O_VERTEXB. The edge S3 is assigned as an incoming edge for the vertex I_VERTEXB1 and the edge S4 is assigned as an incoming edge to the vertex I_VERTEXB2. Also, a first jogging edge, denoted J2, is created from the vertex I_VERTEXB1 to the vertex O_VERTEXB. The corresponding outgoing edge, labeled S2, is assigned to the vertex O_VERTEXB. Likewise, another jogging edge, denoted J3, is created from the vertex I_VERTEXB2 to the vertex O_VERTEXB. Finally, for the vertex A, an input vertex I_VERTEXA and output vertex O_VERTEXA are created as shown in FIG. 6. The edge S2 is assigned as an input edge to the vertex I_VERTEXA and the corresponding outgoing edge, labeled S1, is assigned as an output edge for the vertex O_VERTEXA. Finally, a jogging edge, denoted J1, is created from the vertex I_VERTEXA to the vertex O_VERTEXA. The edge S1 is an input edge to the sink vertex 303. After all of the critical path vertices CDBA have been considered, the critical path subgraph 600 is completed and operation terminates.

Referring back to FIG. 1, after the critical path subgraph 600 is completed at block 105, operation proceeds to next block 107 in which critical edge weights are computed. FIG.

7 is a flow chart diagram illustrating calculation of the critical edge weights for each of the jogging and shear edges of the critical path subgraph 600 in accordance with an embodiment of the invention. As first block 701, a list of the jogging and shear edges belonging to the critical path subgraph 600 is generated (LIST_OF_EDGES). At next block 703, a first or next edge (NEXT_EDGE) from the list of edges is considered, where each edge will be considered one at a time. At next block 705, it is queried whether the edge may be used in a cutset. It is known that an edge that does not have a weight or that has weight of "NONE" cannot be used in the cutset. It is also known that a shear edge connected to the sink or source vertices cannot be used in the cutset. Therefore, edges S1, S5 and S6 will not be used in the cutset. Edges S2 and S3 cannot be used because of insufficient slack based at least in part on the orthogonal constraint graph 400. The geometries for elements B and C cannot be effectively moved in a horizontal direction. Analogously, if vertices of the constraint graph 300 cannot be split, the appropriate jogging edges of the corresponding critical path subgraph also may not be used in the cutset. Thus, the jogging edges J1, J3, J4 and J5 cannot be used in the cutset and are given a weight of "NONE." The appropriate values are included in the following table 1 of edge weights of the critical path subgraph 600:

TABLE 1

EDGE WEIGHTS OF THE CRITICAL PATH SUBGRAPH 600

| | EDGES | | | | | | | | | |
|---|---|---|---|---|---|---|---|---|---|---|
| S1 | S2 | S3 | S4 | S5 | S6 | J1 | J2 | J3 | J4 | J5 |
| WEIGHTS NONE | NONE | NONE | 15 | NONE | NONE | NONE | 15 | NONE | NONE | NONE |

Figure 7:
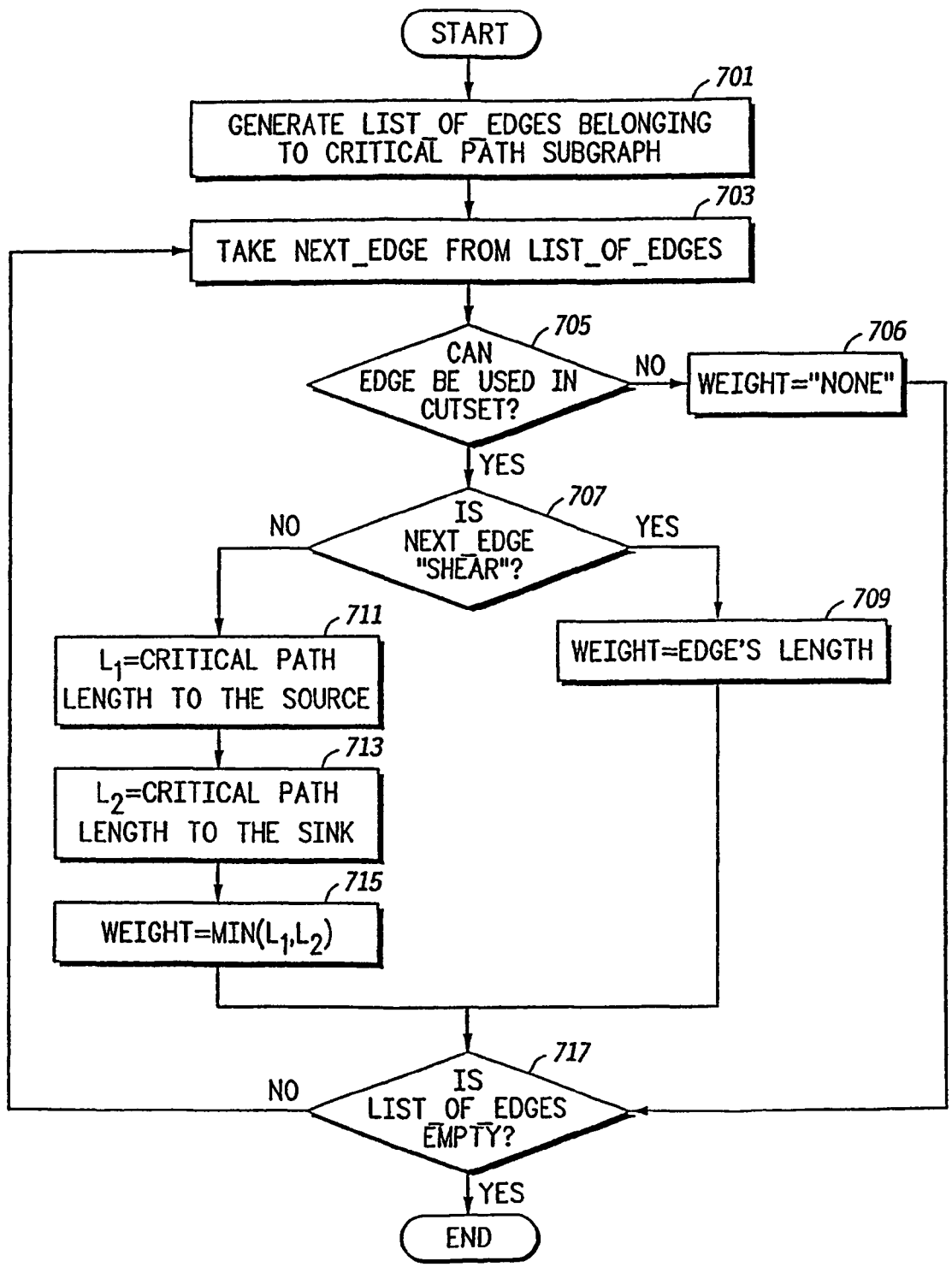
FIG. 7 is a flow chart diagram illustrating calculation of critical edge weights for each jogging and shear edge of the critical path subgraph of FIG. 6.

Referring back to FIG. 7, if the edge cannot be used in the cutset, operation proceeds to next block 706 in which the weight is assigned as "NONE" and operation proceeds to block 717 described further below. Alternatively, if the edge can be used in the outset, operation proceeds to next block 707 in which it is queried whether the next edge is shear. If so, the shear edge's weight is determined as the corresponding length for the shear edge from the constraint graph 300 of the initial layout 200. For example, the weight of edge S4 is assigned as the length of the edge between vertices D and B, or 15. Operation then proceeds from block 709 to block 717. If, however, the edge is not shear, so that the edge is a jogging edge, operation proceeds to block 711 in which a critical path length to the source vertex 301, referred to as L1, is determined. At next block 713, a critical path length to the sink vertex 303, referred to as L2, is determined. Again, the L1 and L2 values are based on the length values from the constraint graph 300. At next box 715, the weight assigned to the jogging edge is determined as the minimum of the L1 and L2 lengths. For example, the jogging edge J2 may be used in the cutset. With reference to FIG. 3, the critical path length to the source vertex 301 is equal to the path between the source vertex 301 and the B vertex having a total length of 0+15=15. The critical path length to the sink vertex 303 is the length of path between the B vertex and the sink vertex 303 which is 13+10=23. At block 715, the weight assigned to the jogging edge J2 is the minimum of (15, 23) which equals 15. The weight is shown in parentheses in FIG. 6 adjacent the J2 jogging edge. The weight of the S4 shearing edge is shown in parenthesis as 15. At block 717, it is determined whether all of the edges have been considered and, if not, operation proceeds back to block 703 to consider the next edge. After all edges are considered, operation is completed.

Figure 8:
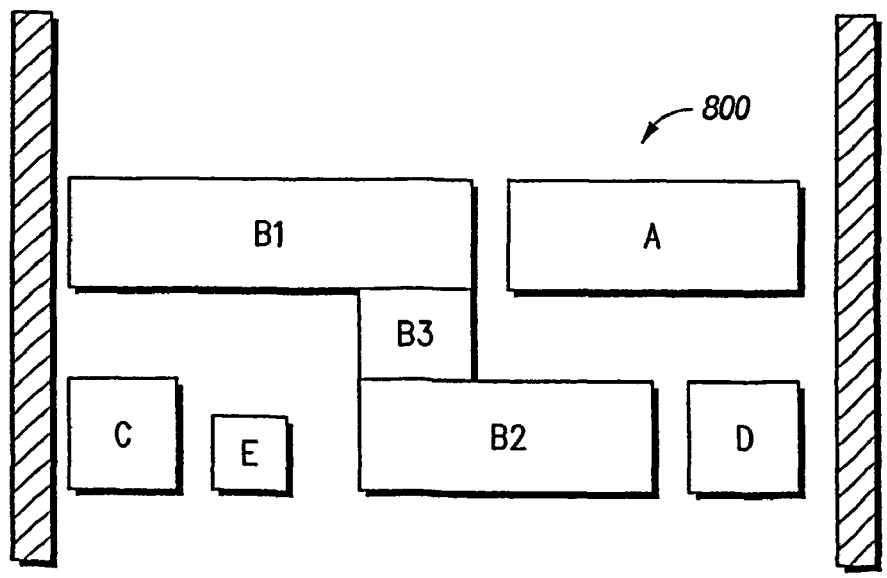
FIG. 8 in an exemplary final layout after compaction.

Referring back to FIG. 1, after the critical edge weights are determined at block 107, at next block 109, an "optimal" outset is determined based on the critical edge weights. Methods for determining a cutset are well known. In the present case, the set of edges that achieve a substantially minimum or a substantially maximum cutset depending upon the particular implementation are determined. A cutset is a set of edges that divide the graph into two separate groups of vertices. The desired or optimal cutset is either the substantially minimum or the substantially maximum cutset based on the sum of the weights of the edges in the particular cutset. As shown in FIG. 6, since only two edges are available for the cutset, including the J2 jogging edge and the S4 shear edge, an optimal cutset 601 is defined as a unique cutset that passes through the edges J2 and S4 to divide the graph into two groups. At next block 111, the critical path is reduced based upon the cutset determined at block 109. The critical path is reduced by effectively removing the cutset edges J2 and S4 from the critical path subgraph 600. Removing a shear edge denotes moving the corresponding circuit element by a certain amount based upon the amount of slack determined by the orthogonal constraint graph 400, otherwise referred to as "shear movement" along the optimal cutset. Removing the S4 shear edge denotes moving the component in the orthogonal direction to a new location as shown by the final layout 800 shown in FIG. 8. Removing a jogging edge denotes a jog insertion by breaking the corresponding element into multiple elements and inserting a jog. This is done for flexible elements, such as the B element. For example, removal of the J2 jogging edge denotes breaking the B element into elements B1 and B2 as shown in FIG. 8, and inserting a jog element B3 between the B1 and B2 elements. Thus, a jog insertion has been performed along the optimal cutset. In this manner, the critical path of the critical path subgraph 600 has been reduced, resulting in a final layout 800 that is compacted relative to the initial layout 200.

It is understood and appreciated that the cutset clearly illustrates layout compaction in two dimensions and further that the shearing and jog insertion methods are performed simultaneously. It is noted that, although the illustrated embodiment shows the optimal cutset as including a jogging edge and a shear edge, the cutset may comprise any combination of jogging and shear edges to achieve a substantially minimal or substantially maximal cutset.

At next block 113, it is determined whether the critical path was reduced at block 111. Since a cutset was found block 109 and the critical path was reduced at block 111, operation proceeds to block 115 to perform a flag operation. A flag (initially cleared) is set at block 115 denoting that the critical path has been reduced in the current iteration.

Operation then returns to block 103 to repeat the one-dimensional compaction in each of the reference and orthogonal directions. The procedure of blocks 103, 105, 107, 109, 111, 113 and 115 is repeated for the selected reference as many times until the critical path is no longer reduced for the selected reference direction. If the critical path is not reduced as determined at block 113, operation proceeds to block 117 at which the flag is checked to determine if the critical path was reduced at all for the reference direction. This occurs when at least two iterations of the compaction steps are performed as indicated by the flag being set at block 115. If the flag is set, operation proceeds to block 119 in which the flag is cleared and then operation proceeds to block 121 in which the orthogonal direction (X) is selected as the reference direction. Consequently, the old reference direction (Y) becomes the orthogonal direction. Operation then returns to block 103 to repeat the compaction operations at blocks 103, 105, 107, 109, 111, 113 and 115 for the orthogonal direction.

The compaction operation is repeated for the orthogonal direction in a similar manner as the reference direction for as many times as necessary until the critical path is no longer reduced as determined at block 113. If the flag has not been set as determined at block 117, then there has been no reduction at all in the critical path for the selected reference direction. Operation then proceeds to block 123 in which it is determined whether both dimensions have been selected and considered. This ensures that both dimensions (the X and Y directions) are each considered at least once in the event that the first selected reference direction does not result in any reduction of the critical path. If both dimensions have not been selected as determined at block 123, operation proceeds to block 121 in which the directions are swapped in order to perform the compaction operation for both directions, and operation proceeds back to block 103. After both dimensions have been selected and considered at least once and when the critical path is no longer reduced, as determined at block 123, operation is completed.

It is appreciated that the an embodiment of the present invention provides a method of layout compaction that combines both the techniques of shearing and jog insertion simultaneously. This provides superior results that achieve a better layout density as compared to other techniques that primarily consider one direction at a time. As a result, layouts are achieved that exhibit superior electrical characteristics due to reduced area and reduced parasitic loads on the signal net layouts. The present compaction technology is essential to other areas of silicon design automation such as process migration. Standard cell layouts may also be synthesized into a library in several technologies. An embodiment of the present invention also may provide better yield by providing smaller geometries on each wafer for fabrication. The new chip may run faster and may even consume less power.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." As used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended, such an intent will be explicitly recited in the claim, and in the absence of such recitation no such limitation is present or intended. For example, in the claims below, when a claim element is described as having "one" feature, it is intended that that element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that that element not be limited to one and only one of the feature described. Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

The above description is intended to describe at least one embodiment of the invention. The above description is not intended to define the scope of the invention. Rather, the scope of the invention is defined in the claims below. Thus, while particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

The invention claimed is:

1. A method of compacting a circuit layout, the method comprising:
   determining a critical path of the circuit layout, the critical path having a length not less than a length of each other path of the circuit layout;
   representing the critical path to include a plurality of vertices and a plurality of edges, each one of the vertices being coupled to another of the vertices by an edge, the plurality of vertices including a flexible vertex corresponding to a flexible element of the circuit layout, the plurality of edges including a first shear edge;

representing the flexible vertex to include a first jogging edge; and determining an optimal cutset of the graph of the critical path, the cutset including at least one of the group consisting of the first jogging edge and the first shear edge.

2. The method of claim 1 wherein the optimal cutset includes both the first jogging edge and the first shear edge.

3. The method of claim 1 further comprising:

reducing the length of the critical path by performing a jog insertion and a shear movement along the optimal cutset.

4. The method of claim 1 further comprising:

reducing the length of the critical path by performing at least one of the group consisting of a jog insertion at the first jogging edge of the flexible vertex and a shear movement at the first shear edge.

5. The method of claim 1 further comprising:

reducing the length of the critical path by performing a jog insertion at the first jogging edge of the flexible vertex and a shear movement at the first shear edge.

6. The method of claim 1 further comprising:

performing a one-dimensional compaction of the circuit layout in a first direction before determining the critical path; and performing a one-dimensional compaction of the circuit layout in a second direction after performing the one-dimensional compaction in the first direction.

7. The method of claim 6 further comprising selecting the critical path in the first direction of the circuit layout.

8. The method of claim 1 wherein:

each vertex corresponds to a circuit element of the circuit layout; and each edge defines a minimum space relationship between circuit elements corresponding to vertices to which each edge is coupled.

9. The method of claim 1 wherein the flexible vertex is represented to further include a second jogging edge;

the optimal cutset is determined to include at least one of the first and second jogging edges and to include the shear edge.

10. The method of claim 9 wherein the plurality of edges further includes a second shear edge; and the optimal cutset is determined to include at least one of the first and second jogging edges and at least one of the first and second shear edges.

11. A computer program product encoded in computer readable media, the computer program product comprising:

first instructions, executable on a data processing system, for determining a critical path of a circuit layout;

second instructions, executable on the data processing system, for representing the critical path to include a plurality of vertices and a plurality of edges, each one of the plurality of vertices being coupled to another of the vertices by an edge, the plurality of vertices including a flexible vertex corresponding to a flexible element of the circuit layout, the plurality of edges including a first shear edge;

third instructions, executable on the data processing system, for representing the flexible vertex to include a first jogging edge; and fourth instructions, executable on the data processing system, for determining a optimal cutset of the graph of the critical path, the cutset including at least one of the group consisting of the first jogging edge and the first shear edge.

* * * * *